(12) United States Patent
Eom et al.

(10) Patent No.: US 7,449,738 B2
(45) Date of Patent: Nov. 11, 2008

(54) STRAIN-ENGINEERED FERROELECTRIC THIN FILMS

(75) Inventors: Chang-Beom Eom, Madison, WI (US); Kyung-Jin Choi, Madison, WI (US); Darrell G. Schlom, State College, PA (US); Long-Qing Chen, College Park, PA (US)

(73) Assignee: Wisconsin Alumni Research Foundation, Madison, WI (US)

( * ) Notice: Subject to any disclaimer, the term of this patent is extended or adjusted under 35 U.S.C. 154(b) by 115 days.

(21) Appl. No.: 10/977,335

(22) Filed: Oct. 29, 2004

(65) Prior Publication Data

US 2006/0091434 A1 May 4, 2006

(51) Int. Cl.
*H01L 29/76* (2006.01)
*H01L 29/94* (2006.01)

(52) U.S. Cl. .................................................. 257/295

(58) Field of Classification Search ................ 257/295, 257/E21.664; 438/3
See application file for complete search history.

(56) References Cited

U.S. PATENT DOCUMENTS

| | | | |
|---|---|---|---|
| 5,374,578 A * | 12/1994 | Patel et al. ...................... | 438/3 |
| 5,760,432 A | 6/1998 | Abe et al. | |
| 5,889,299 A | 3/1999 | Abe et al. | |
| 6,533,906 B2 | 3/2003 | Kawakubo et al. | |
| 6,747,529 B2 | 6/2004 | Abe et al. | |

OTHER PUBLICATIONS

C.B. Eom, et al., "Fabrication and Properties of Epitaxial Ferroelectric Heterostructures with (SrRu$_3$) Isotropic Metallic Oxide Electrodes," Appl. Phys. Lett, vol. 63, No. 18, Nov. 1, 1993, pp. 2570-2572.

N.A. Pertsev, et al., "Effect of Mechanical Boundary Conditions on Phase Diagrams of Epitaxial Ferroelectric Thin Films," Phys. Rev. Lett., vol. 80, No. 9, Mar. 2, 1998, pp. 1988-1991.

E.D. Specht, et al., "X-Ray Diffraction Measurement of the Effect of Layer Thickness on the Ferroelectric Transition in Epitaxial KTaO$_3$/KNbO$_3$ Multilayers," Phys. Rev. Lett., vol. 80, No. 10, May 11, 1998, pp. 4317-4320.

M. Sepliarsky, et al., "Ferroelectric Phase Transitions and Dynamical Behavior in KnbO$_3$/KTaO$_3$ Superlattices by Molecular-Dynamics Simulation," J. Appl. Phys., vol. 91, No. 5, Mar. 1, 2002, pp. 3165-3171.

S.K. Streiffer,et al., "Observation of Nanoscale 180° Stripe Domains in Ferroelectric PbTiO$_3$ Thin Films," Phys. Rev. Lett., vol. 89, No. 6, Aug. 5, 2002, pp. 067601-1-067601-4.

J. Schubert, et al., "Structural and Optical Properties of Epitaxial BaTiO$_3$ Thin Films Grown on GdScO$_3$(110)," Appl. Phys. Lett., vol. 82, No. 20, May 19, 2003, pp. 3460-3462.

K.J. Choi and C.B. Eom, "Strain-Induced Enhancement of Phase Transition Temperature in Epitaxial BaTiO$_3$ Thin Films on (110) GdScO$_3$ Substrates," Materials Research Society Symposium C: Ferroelectric Thin Films XII, Dec. 2003 (Abstract), 1 page.

* cited by examiner

*Primary Examiner*—Hung Vu
(74) *Attorney, Agent, or Firm*—Foley & Lardner LLP

(57) ABSTRACT

A strained thin film structure includes a substrate layer formed of a crystalline scandate material having a top surface, and a strained layer of crystalline ferroelectric epitaxially grown with respect to the crystalline substrate layer so as to be in a strained state and at a thickness below which dislocations begin to occur in the crystalline ferroelectric layer. An intermediate layer may be grown between the top surface of the substrate layer and the ferroelectric layer wherein the intermediate layer carries the lattice structure of the underlying substrate layer. The properties of the ferroelectric film are greatly enhanced as compared to the bulk ferroelectric material, and such films are suitable for use in applications including ferroelectric memories.

32 Claims, 8 Drawing Sheets

US 7,449,738 B2

STRAIN-ENGINEERED FERROELECTRIC THIN FILMS

STATEMENT OF GOVERNMENT RIGHTS

This invention was made with United States government support awarded by the following agencies: NSF 0296021, 0103354 and 01222638. The United States government has certain rights in this invention.

FIELD OF THE INVENTION

This invention pertains generally to the field of semiconductor and related device manufacturing and particularly to thin film structures.

BACKGROUND OF THE INVENTION

Very large strains can exist in thin films of one material deposited on another material due to differences in crystal lattice parameters and thermal expansion behavior between the thin film and the underlying substrate, or arising from defects formed during film deposition. As a result, the properties of such thin films can be dramatically different than the intrinsic properties of the corresponding unstrained bulk materials. Such strain may be undesirable and lead to degraded film properties, but in appropriate cases and at appropriate strain levels, the strain in the thin film can actually enhance the properties of the thin film for use in certain applications. One example is in the production of more environmentally benign ferroelectric random access memories (FeRAM). Large shifts in the transition temperature $T_c$ and remanent polarization $P_r$ are expected and have been observed in various ferroelectric materials. The two materials most widely being investigated for use for FeRAM devices are $Pb(Zr,Ti)O_3$ and $SrBi_2Ta_2O_9$. The major disadvantages in the use of these two materials are the volatility of the lead and bismuth constituents of these materials, which complicates their introduction into semiconductor fabrication facilities, and environmental issues associated with the toxicity of lead. Thus, it would be desirable to have other suitable thin film ferroelectric materials with constituents that are not as volatile and which do not impose potential environmental risks.

SUMMARY OF THE INVENTION

In accordance with the present invention, the properties of ferroelectric materials are enhanced using appropriate control of the strain in thin films of such material for use in various applications including ferroelectric memories and electro-optical modulators. The thin films of ferroelectrics can have relatively non-volatile and non-toxic constituents which are well suited for semiconductor fabrication facilities and which are compatible with existing processing of silicon based devices. By control of the strain in the ferroelectric thin films in accordance with the present invention, much higher ferroelectric transition temperatures and much greater remanent polarizations can be achieved as compared to bulk single crystals of the same materials.

A strained thin film structure in accordance with the invention includes a substrate layer formed of a crystalline rare earth scandate material having a top surface. A strained layer of crystalline ferroelectric material is epitaxially grown with respect to the crystalline substrate layer so as to be in a strained state and at a thickness below which dislocations begin to occur in the crystalline ferroelectric layer. Preferably, the thickness of the ferroelectric layer is less than 5 μm, and most preferably between 1 μm and 50 Å. An intermediate layer may be grown between the top surface of the substrate layer and the ferroelectric layer wherein the intermediate layer carries the lattice structure of the underlying substrate layer. An appropriate intermediate layer is epitaxially grown on the top surface of the substrate and on which the strained layer of crystalline ferroelectric is epitaxially grown. An additional layer can be formed over the ferroelectric layer such that the layers separated by the ferroelectric layer function as plates of a capacitor. Such capacitor structures can be utilized in ferroelectric capacitive memory cells and in other applications. Further, the substrate layer may be formed on a crystalline silicon base so as to allow the devices in accordance with the present invention to be integrated with circuitry formed on the silicon base.

Examples of preferred materials include $GdScO_3$ and $DyScO_3$ for the rare earth scandate substrate layer, $BaTiO_3$ for the ferroelectric layer, and $SrRuO_3$ for the intermediate layer.

Further objects, features and advantages of the invention will be apparent from the following detailed description when taken in conjunction with the accompanying drawings.

DETAILED DESCRIPTION OF THE INVENTION

The present invention utilizes detailed investigations of the properties of ferroelectric thin films to achieve significantly improved ferroelectric properties as compared to the bulk ferroelectric. The present invention may be used with various crystalline ferroelectrics, examples only of which are BaTiO$_3$, lead zirconium titanate (PZT), BiFeO$_3$, and lead magnesium niobate-lead titanate (PMN-PT). For purposes of illustration, the invention is exemplified below with respect to BaTiO$_3$, a preferred ferroelectric material, but it is understood that the invention is not limited thereto.

Figure 1:
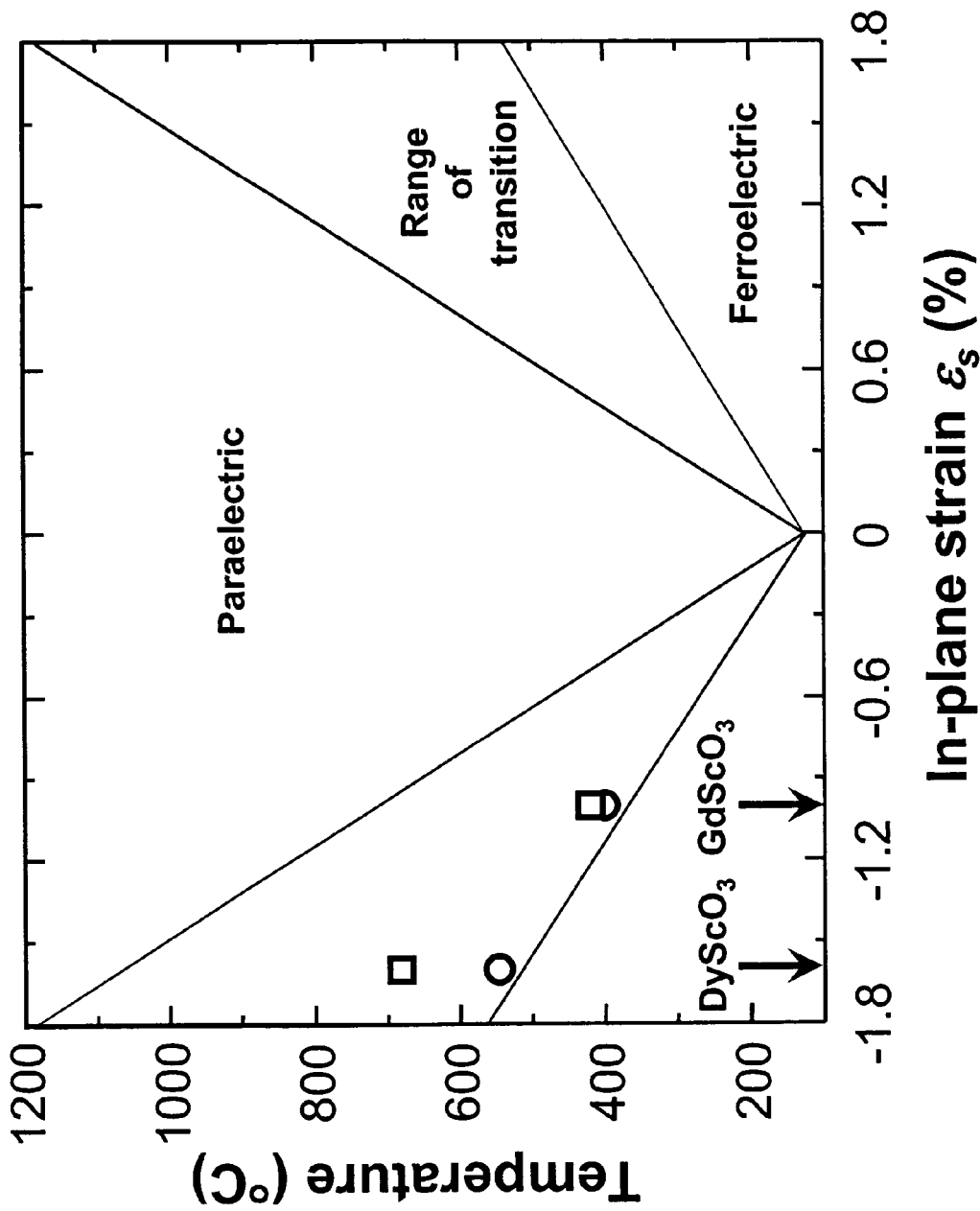
FIG. 1 is a diagram showing the expected $T_c$ of (001) $BaTiO_3$ under biaxial in-plane strain ($\epsilon_s$), based on thermodynamic analyses, with the data points showing the observed $\epsilon_s$ and $T_c$ values for coherent $BaTiO_3$ films grown by MBE (circles) and by PLD (squares) on $GdScO_3$ and $DyScO_c$ substrates.

To predict the T$_C$ enhancement and the temperature dependence of the lattice parameters of BaTiO$_3$ thin films under large biaxial strains using Landau thermodynamic theories, we determined a new set of phenomenological coefficients, since existing ones are only applicable to small compressive strains (<~0.4%). FIG. 1 shows the T$_C$ enhancement predicted from thermodynamic analysis for a BaTiO$_3$ thin film under biaxial strain $$\varepsilon_s = \frac{a_{11} - a_0}{a_0},$$

where a$_0$ is the lattice parameter of free-standing cubic BaTiO$_3$ and a$_{11}$ is the in-plane lattice parameter of a biaxially strained (001) BaTiO$_3$ film. The dark shaded range of transition region shows the range in predicted T$_C$ due to the range of reported property coefficients for BaTiO$_3$ that enter into the thermodynamic analysis. FIG. 1 implies that a biaxial compressive strain of only ~1% should be sufficient to produce strained (001) BaTiO$_3$ films with a T$_C$ comparable to or higher than unstrained Pb(Zr,Ti)O$_3$ films.

Although FIG. 1 might seem to imply that T$_C$ can be enhanced without bound, there are limits to strain engineering. The driving force for film relaxation increases with strain and film thickness. When films are grown to thicknesses greatly exceeding their critical values, relaxation toward a zero-strain state by the introduction of dislocations begins. Thus, it is important to grow films below, or at least close to, their critical thickness for relaxation. As the critical thickness at which dislocations begin to form varies approximately inversely with lattice mismatch, lower mismatch is desired to allow strained BaTiO$_3$ films to grow that are thick enough to allow their ferroelectric properties to be conveniently probed or utilized in devices. FIG. 1 only applies to thick strained ferroelectrics; as ferroelectrics get thin (<~100 Å), their ferroelectric properties can be drastically diminished by finite-size effects. Optimizing the trade off between strain and film thickness depends on the particular application. For FeRAMs, films several hundred angstroms in thickness are needed. Based on the equilibrium critical thickness for BaTiO$_3$, this would constrain $\epsilon_S$ to be less than about 0.5%; however, we have found that it is possible to grow 500 Å thick coherent BaTiO$_3$ films at $\epsilon_s$=−1.7%.

Figure 2:
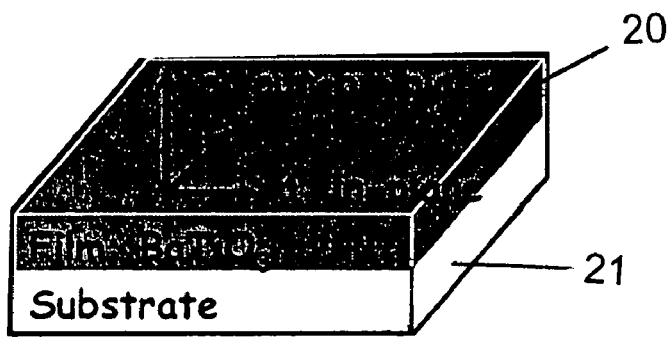
FIG. 2 is a simplified diagram showing a film of $BaTiO_3$ grown on a substrate of $GdScO_3$ or DyScO FIG. 3 are two-dimensional images at selected temperatures of the x-ray diffraction peaks from a $BaTiO_3$ single crystal and from strained $BaTiO_3$ thin films.

Single crystal substrates of GdScO$_3$ and DyScO$_3$ were used because they are structurally, chemically, and thermally compatible with BaTiO$_3$, and they have appropriate lattice constants to impart $\epsilon_s$ of about −1.0% and −1.7%, respectively, on coherent (001) BaTiO$_3$ films. As illustrated in FIG. 2, BaTiO$_3$ thin films 20 were epitaxially grown on (110) GdScO$_3$ and (110) DyScO$_3$ substrate layers 21 by reactive molecular beam epitaxy (MBE) and by pulsed laser deposition (PLD) with in situ high-pressure reflection high-energy electron diffraction, as discussed in further detail below.

The lattice parameters of the strained (001) BaTiO$_3$ thin films are summarized in Table 1. These films are epitaxial, purely c-axis oriented (the c-axis of all BaTiO$_3$ domains is perpendicular to the wafer surface as illustrated in FIG. 2) and, with the exception of the 2000 Å thick BaTiO$_3$ film on DyScO$_3$, are fully coherent with the substrates, without any resolvable lattice relaxation.

TABLE 1

Results from high-resolution x-ray diffraction measurements on the films. The in-plane (a) and out-of-plane (c) lattice constants and full width at half maximum (FWHM) of rocking curves of various peaks (002 of BaTiO$_3$, 200$_{pseudo-cubic}$ of SrRuO$_3$ and 200$_{pseudo-cubic}$ of GdScO$_3$ and DyScO$_3$) at room temperature are given.

|  |  | a(±0.002)(Å) | c(±0.0005)(Å) | FWHM(°) |
|---|---|---|---|---|
| MBE |  |  |  |  |
| BaTiO$_3$ (1000 Å) | BaTiO$_3$ | 3.964 | 4.0693 | 0.080 |
| on GdScO$_3$ | GdScO$_3$ | 3.965 | 3.9638 | 0.009 |
| BaTiO$_3$ (500 Å) | BaTiO$_3$ | 3.940 | 4.0953 | 0.120 |
| on DyScO$_3$ | DyScO$_3$ | 3.943 | 3.9396 | 0.009 |
| PLD |  |  |  |  |
| BaTiO$_3$ (2000 Å) | BaTiO$_3$ | 3.965 | 4.0692 | 0.042 |
| on SrRuO$_3$ | SrRuO$_3$ | 3.968 | 3.9052 | 0.036 |
| (1000 Å) |  |  |  |  |
| on GdScO$_3$ | GdScO$_3$ | 3.964 | 3.9646 | 0.008 |
| BaTiO$_3$ (500 Å) | BaTiO$_3$ | 3.939 | 4.0989 | 0.045 |
| on SrRuO$_3$ | SrRuO$_3$ | 3.943 | 3.9110 | 0.022 |
| (2000 Å) |  |  |  |  |
| on DyScO$_3$ | DyScO$_3$ | 3.944 | 3.9396 | 0.009 |
| BaTiO$_3$ (2000 Å) | BaTiO$_3$ | 3.958 | 4.0819 | 0.135 |
| on SrRuO$_3$ | SrRuO$_3$ | 3.947 | 3.9187 | 0.047 |
| (1000 Å) |  |  |  |  |
| on DyScO$_3$ | DyScO$_3$ | 3.944 | 3.9398 | 0.009 |
| BaTiO$_3$ single crystal | (published reference data) | 3.992 | 4.036 Å |  |

Figure 3:
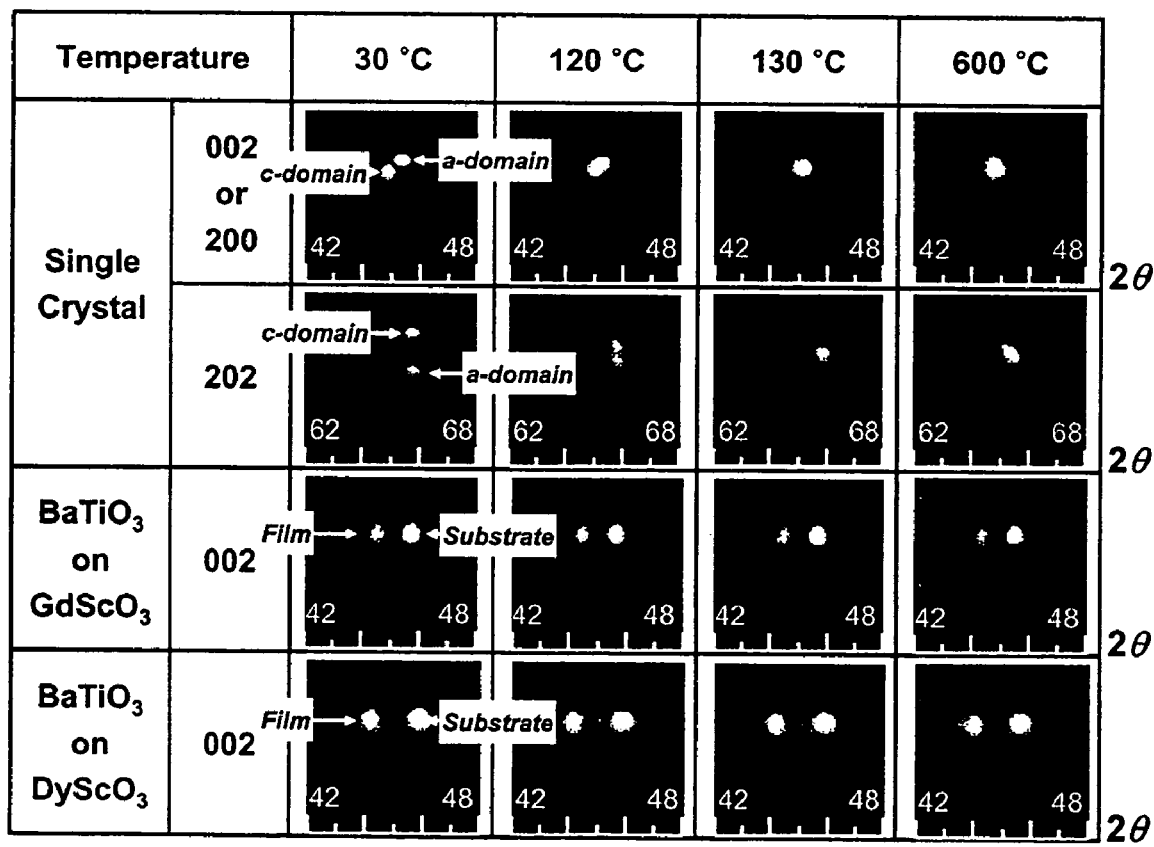

To identify the ferroelectric phase transition, the temperature dependence of the in-plane and out-of-plane lattice parameters of the films and substrates was measured using a variable-temperature four-circle x ray diffractometer equipped with a two-dimensional (2 D) area detector with an angular resolution of ~0.02°. Unstrained BaTiO$_3$ undergoes a ferroelectric transition at about 130° C. from the high-temperature cubic (Pm3̄m) to the low-temperature tetragonal (P4 mm) phase. FIG. 3 shows 2-D images of the 002 and 202 diffraction peaks at selected temperatures from a BaTiO$_3$ single crystal as well as from coherent BaTiO$_3$ thin films grown on (110) GdScO$_3$ and (110) DyScO$_3$ substrates. There is no significant change in the diffraction peaks of the BaTiO$_3$ thin films at or above T$_c$~130° C. As expected, the single diffraction spot of the BaTiO$_3$ single crystal splits into two below 130° C., corresponding to a and c domains of the tetragonal (P4 mm) ferroelectric phase.

Figure 4:
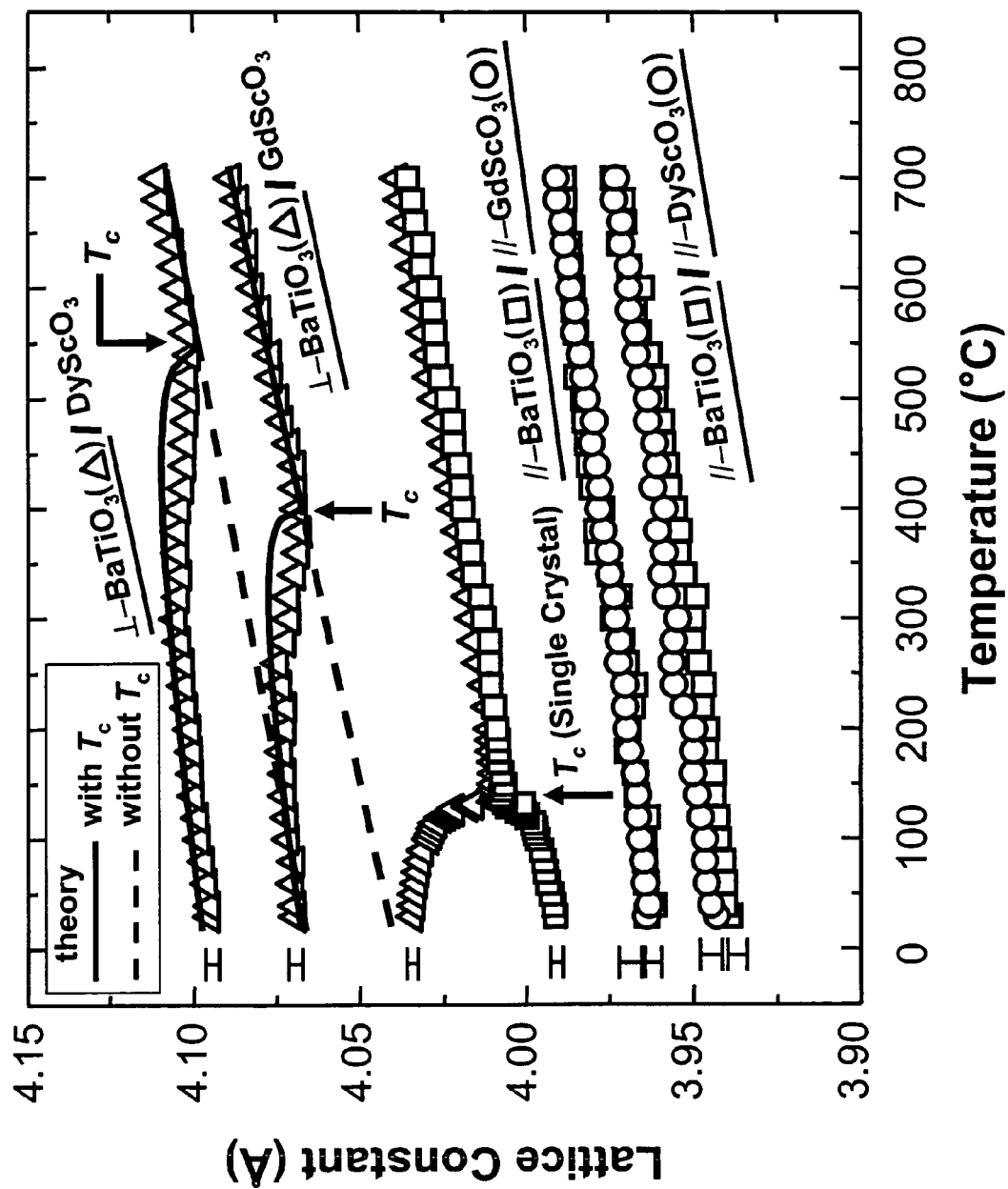
FIG. 4 are graphs showing the temperature dependence of the lattice parameters of single crystal $BaTiO_3$ (c-axis triangles and a-axis squares) and strained $BaTiO_3$ thin films grown by MBE on $DyScO_3$ substrates (triangles for out-of-plane $BaTiO_3$, squares for in-plane $BaTiO_3$, and circles for in-plane $DyScO_3$) and on $GdScO_3$ substrates (triangles for out-of-plane $BaTiO_3$, squares for in-plane $BaTiO_3$, and circles for in-plane $GdScO_3$); wherein the changes in slope at high temperature signal a phase transition.

The in-plane and out-of-plane lattice parameters of the strained BaTiO$_3$ films grown by MBE were determined from the 202 and 002 diffraction peaks and are plotted as a function of temperature in FIG. 4. The in-plane lattice parameters of the BaTiO$_3$ layer are coherent to the underlying substrates over the entire temperature range (25-700° C.). There are striking differences in the evolution of the lattice parameters with temperature between the unstrained BaTiO$_3$ single crystal and the strained BaTiO$_3$ thin films. Notably, the BaTiO$_3$ thin films never become cubic; they remain tetragonal due to the biaxial substrate constraint. The predicted dependence of the c lattice parameter of biaxially strained BaTiO$_3$, with and without a ferroelectric phase transition, was calculated from thermodynamic analysis and is shown by the solid curve and dashed curve, respectively, in FIG. 4. As the BaTiO$_3$ film is clamped in-plane, all structural changes due to the phase transition and thermal expansion are accommodated through changes in the out-of-plane lattice parameter only. The agreement between the prediction and the measured c axis lattice parameters in FIG. 4 is strong evidence that the change in slope in the c axis lattice parameter at high temperature corresponds to a ferroelectric phase transition. Analogous lattice constant behavior has been observed in other constrained ferroelectric films (E. D. Specht, et al., Phys. Rev. Lett. 80, 4317 (1998); S. K. Streiffer, et al., Phys. Rev. Lett. 89, 067601 (2002)), is consistent with theory (M. Sepliarsky, et al., J. Appl. Phys. 91, 3165 (2002); S. K. Streiffer, et al. (2002), supra), and has been used to determine T$_c$. The T$_c$ of the coherent BaTiO$_3$ thin films shown in FIG. 4 are ~400° C. on GdScO$_3$ and ~540° C. on DyScO$_3$.

Figure 5:
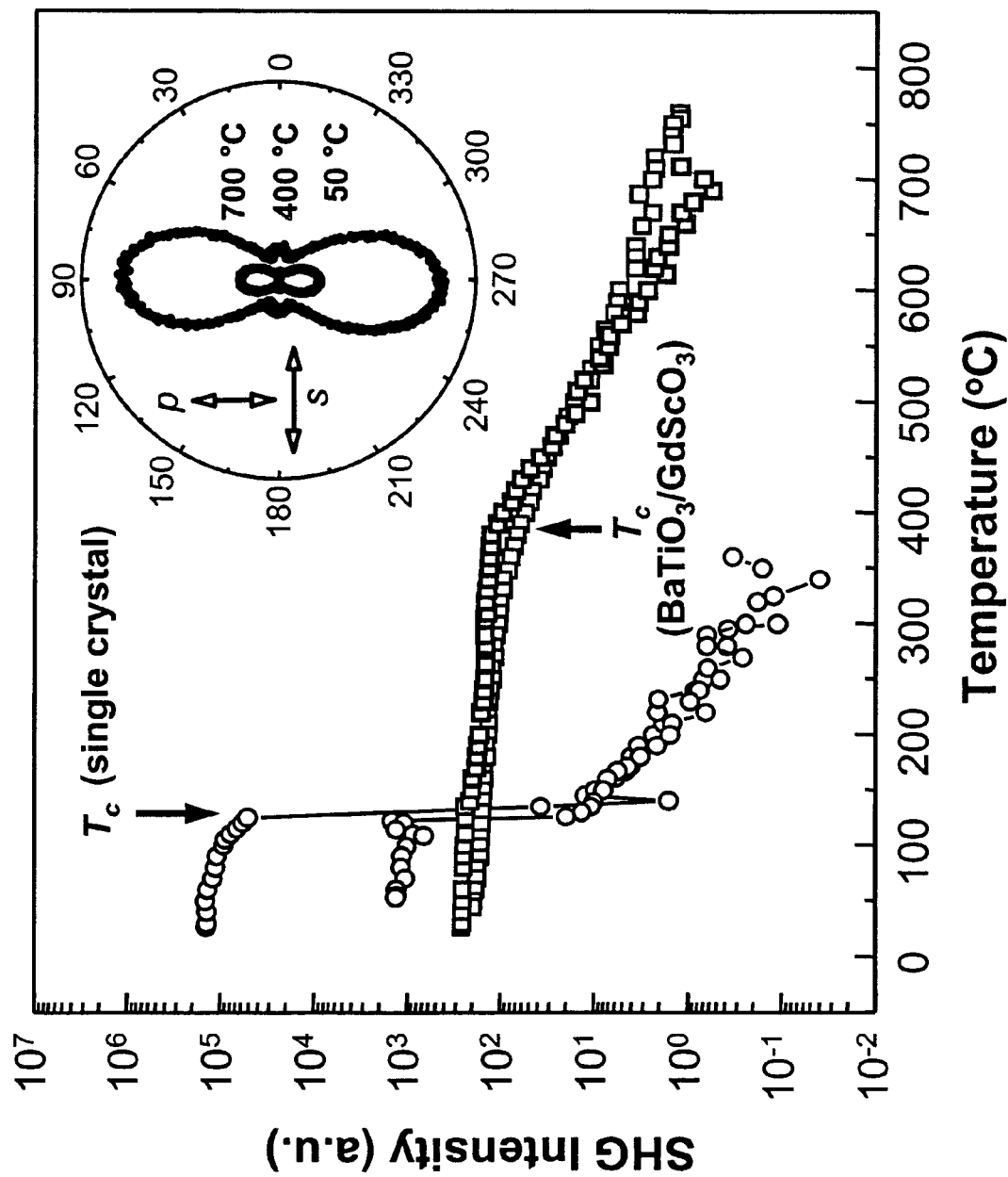
FIG. 5 are graphs showing optical SHG signals from a $BaTiO_3$ single crystal (open circles for heating and closed circles for cooling) and from the same strained $BaTiO_3$ film on $GdScO_3$ as in FIG. 4 (open squares for heating and closed squares for cooling), with the inset showing polar plots of SHG intensity (radius) versus fundamental polarization (azimuth), with circles representing experimental data and solid lines representing calculations from theory.

To confirm the huge shifts in T$_c$, measurements were made of polarization hysteresis loops on a 2000 Å thick coherent BaTiO$_3$ film grown by PLD on a coherent SrRuO$_3$ bottom electrode on (110) GdScO$_3$. At temperatures up to about 200° C., hysteresis loops were clearly seen, but at higher temperatures the dielectric losses in the films became too high for reliable measurements. Second harmonic generation (SHG) measurements were made as a function of temperature on this PLD-grown BaTiO$_3$/SrRuO$_3$/GdScO$_3$ sample as well as the MBE-grown BaTiO$_3$/GdScO$_3$ sample whose lattice constants vs. temperature behavior is shown in FIG. 4. An SHG signal is only exhibited by materials that lack inversion symmetry. All ferroelectrics must lack inversion symmetry, but there are many materials that lack inversion symmetry and are not ferroelectric. This makes SHG a necessary but insufficient probe for ferroelectricity. Nonetheless, FIG. 5 shows that the phase that is known from hysteresis loops to be ferroelectric at room temperature remains non-centrosymmetric to the same high temperature where x-ray diffraction indicates a phase transition. The interpretation consistent with all of these analyses—x-ray diffraction, SHG, and hysteresis measurements—is that biaxial compressive strain increases the T$_c$ of BaTiO$_3$.

Figure 6:
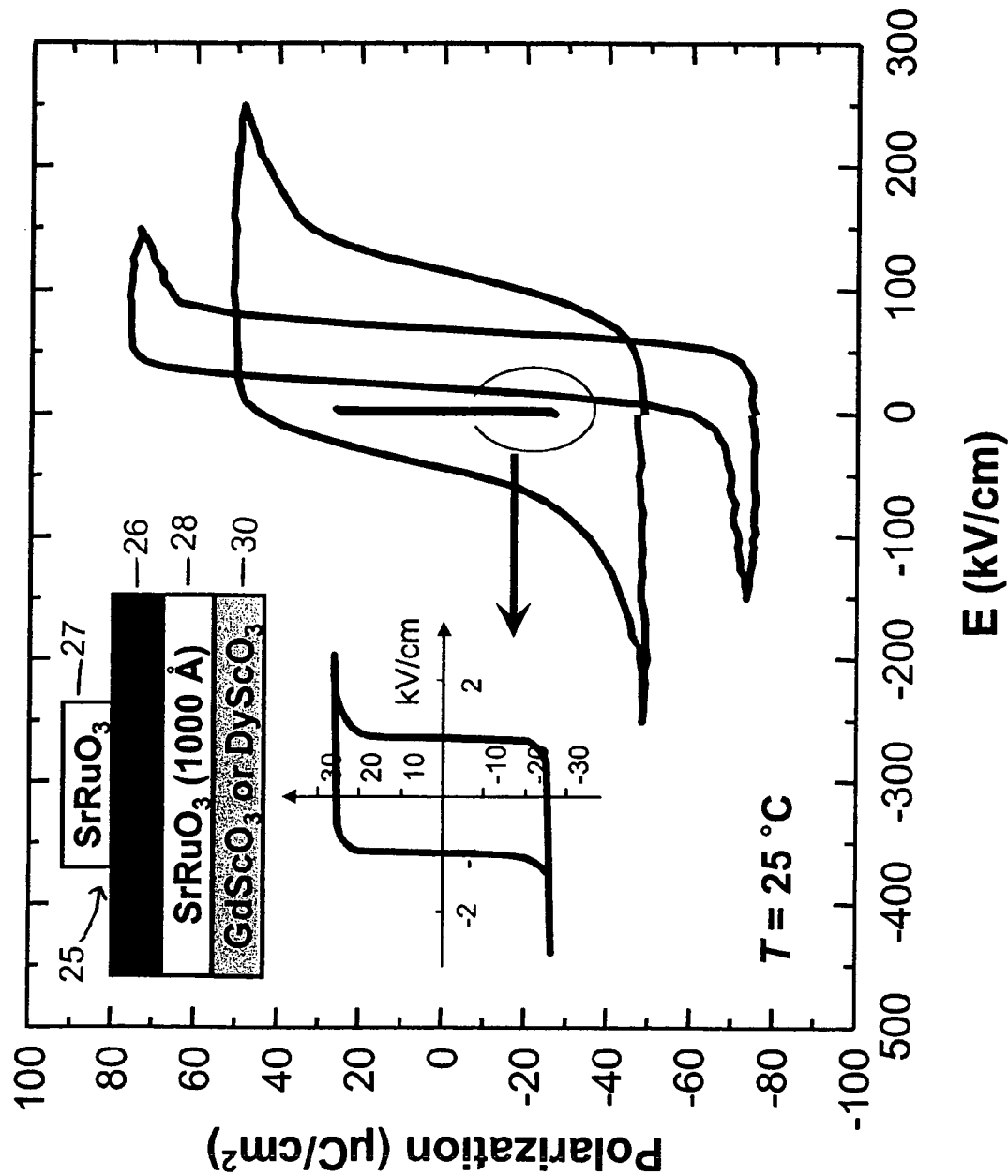
FIG. 6 are graphs showing polarization-electric field hysteresis loops of $BaTiO_3$ thin film (2000 Å) capacitors grown by PLD on $GdScO_3$ and $DyScO_3$ with $SrRuO_3$ top and bottom electrodes, with the inset showing the hysteresis loop of an unstrained bulk $BaTiO_3$ single crystal for comparison purposes.

Hysteresis measurements were made on 200 μm diameter capacitors, shown for illustration at 25 in FIG. 6, of a strained BaTiO$_3$ thin film 26 sandwiched between epitaxial top and bottom electrodes 27 and 28 of the conducting perovskite oxide SrRuO$_3$ which was grown epitaxially on substrate layers 30 of GdScO$_3$ and DyScO$_3$. High-resolution x-ray diffraction measurements (summarized in Table 1) revealed the BaTiO$_3$ ferroelectric layers as well as the 1000 Å thick SrRuO$_3$ bottom electrodes to be fully coherent with the underlying substrates. No relaxation was observed even for BaTiO$_3$ films as thick as 500 Å on DyScO$_3$ and 2000 Å on GdScO$_3$. The critical thicknesses of BaTiO$_3$ thin films grown on coherent SrRuO$_3$ bottom electrodes on GdScO$_3$ and DyScO$_3$ are higher than those of BaTiO$_3$ films grown directly on GdScO$_3$ and DyScO$_3$. This observation is consistent with critical thickness theory, where the difference arises from strain partitioning between the layers as well as the altered geometry of misfit dislocations in a single layer versus a bilayer. Because the leakage in the coherent stack containing a 500 Å thick BaTiO$_3$ layer on DyScO$_3$ was too high for good ferroelectric hysteresis measurements, a SrRuO$_3$/BaTiO$_3$/SrRuO$_3$/DyScO$_3$ stack was grown with a 2000 Å thick BaTiO$_3$ layer. This latter stack had low leakage; however, it was partially relaxed.

FIG. 6 shows the ferroelectric hysteresis loops measured on the ferroelectric stacks grown on GdScO$_3$ and DyScO$_3$ substrates 30 with 2000 Å thick BaTiO$_3$ layers, together with results from a BaTiO$_3$ single crystal for comparison. The hysteresis loops are shifted in the positive voltage direction. This imprint effect is probably due to the asymmetric interfacial properties of the top and bottom electrodes to the BaTiO$_3$ films. Even though SrRuO$_3$ was used for both electrodes, the growth temperature (350° C.) of the top electrode was much lower than that of the bottom electrode (680° C.), which might lead to poor crystallinity of the top electrode and asymmetric interfaces. The P$_r$ and coercive field (E$_r$) were determined to be ~50 μC/cm$^2$ and 80 kV/cm for the fully coherent BaTiO$_3$/GdScO$_3$ sample and ~70 μC/cm$^2$ and 25 kV/cm for the partially relaxed BaTiO$_3$/DyScO$_3$ sample, respectively. This P$_r$ value is almost 270% of the 26 μC/cm$^2$ of single crystal BaTiO$_3$, 250% higher than the switched charge density assumed in the scaling analysis of FeRAM, and comparable to the P$_r$ of unstrained Pb(Zr,Ti)O$_3$ films. As this P$_r$ of ~70 μC/cm$^2$ was observed in a partially relaxed sample with $\epsilon_s$ of −1.3%, a coherently strained BaTiO$_3$/DyScO$_3$ sample with $\epsilon_s$ of −1.7%, can have an even higher P$_r$.

Another important feature for the application of ferroelectric capacitors to memory devices is the loss of switched polarization after repeated switching, i.e., fatigue. Fatigue measurements were performed by applying 8.6 μs wide pulses with a repetition frequency of 10 kHz to the top and bottom SrRuO$_3$ electrodes of the SrRuO$_3$/BaTiO$_3$/SrRuO$_3$/GdScO$_3$ structure at V$_{max}$=4 V (200 kV/cm). The switched polarization decreased by 10% of its original value after 10$^6$ fatigue cycles, but recovered its original value after 10$^{10}$ cycles. This is consistent with previous observations of fatigue-free behavior when conducting oxide electrodes are used.

Figure 7:
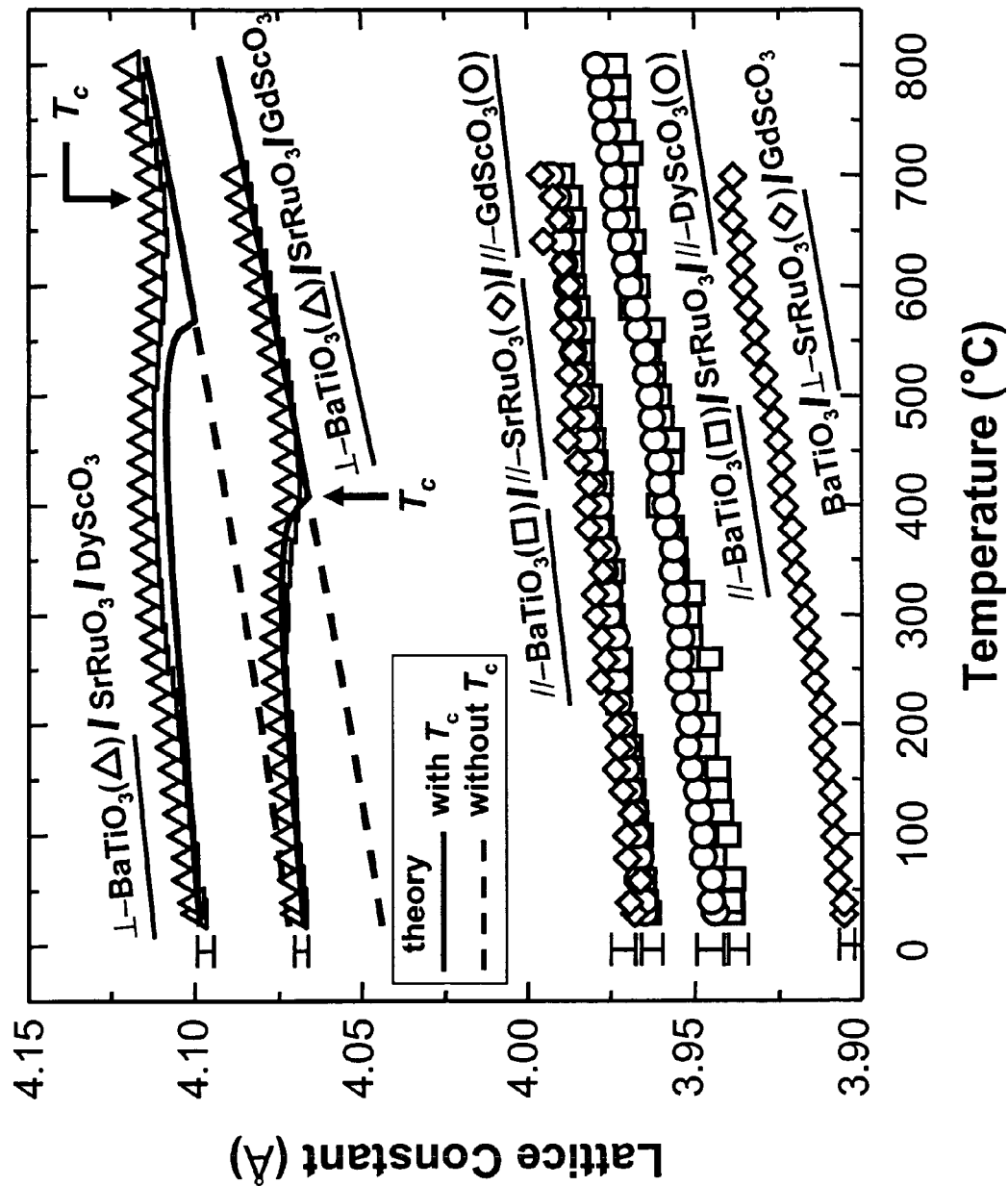
FIG. 7 are graphs showing temperature dependence of the lattice parameters of strained $SrRuO_3/BaTiO_3/SrRuO_3$ capacitor structures grown by PLD on $DyScO_3$ substrates (closed triangles for out-of-plane $BaTiO_3$, open squares for in-plane $BaTiO_3$, open circles for in-plane $DyScO_3$) and on $GdScO_3$ substrates (closed triangles for out-of-plane $BaTiO_3$, open squares for in-plane BaTiO$_3$, and open circles for in-plane GdScO$_3$), with the change in slope at high temperature indicating a phase transition.

As a verification that the enhancement of T$_c$ observed in coherently strained BaTiO$_3$ thin films grown by MBE (see FIG. 4) is inherent and applicable to a device structure with a conductive bottom electrode, high-temperature x-ray diffraction measurements were performed on the coherent BaTiO$_3$ thin films with SrRuO$_3$ bottom electrodes grown by PLD. FIG. 7 shows the evolution of the in-plane (a) and out-of-plane (c) lattice parameters of the BaTiO$_3$ film and the GdScO$_3$ and DyScO$_3$ substrates as a function of temperature. The in-plane lattice parameters reveal that both the BaTiO$_3$ and SrRuO$_3$ layers are coherently strained to the underlying substrates over the entire temperature range. This is consistent with the absence of misfit dislocations along the interface between GdScO$_3$ and SrRuO$_3$ and along the interface between SrRuO$_3$ and BaTiO$_3$ as shown by the cross-sectional transmission electron microscope images. The transition behavior of the PLD samples was found to be quite similar to those grown by MBE. T$_c$ was determined to be ~420° C. and ~680° C. for samples grown on GdScO$_3$ and DyScO$_3$, respectively. The solid and dashed lines in FIG. 7 are theoretical predictions of c-lattice parameters with and without the ferroelectric phase transition, which are fairly consistent with the experimentally measured values. The agreement in the results for films grown by MBE and PLD indicates that the observed shifts in ferroelectric properties with strain represent the intrinsic behavior of strained BaTiO$_3$. Note also that this experimental dependence of T$_c$ on ϵ$_s$ is consistent with the expectations shown in FIG. 1. It is understood that other film growth processes may be used in addition to MBE and PLD, including sputtering and chemical vapor deposition (CVD and MOCVD).

The foregoing examples demonstrate that the properties of ferroelectric can be dramatically enhanced through strain engineering. These strain-engineered heteroepitaxial thin films provide a broad range of operating temperatures as well as higher remanent polarization for improved noise immunity and the ability to scale FeRAM to smaller cell sizes. The ability to withstand huge strains gives thin films a degree of freedom that is not available in the bulk material. This can be exploited to enhance the ferroelectric properties of any ferroic system, including multiferroics, whose ferroic order parameter has a strong coupling to strain.

The (110) GdScO$_3$ and (110) DyScO$_3$ substrates used in the examples above are two of a series of rare-earth scandates with pseudocubic lattice constraints that range from 3.93 Å to 4.05 Å in roughly 0.01 Å increments as the rare earth species is varied. These rare earth scandates have the GdFeO$_3$-type orthorhombic structure (space group: Pbnm). GdScO$_3$ has lattice constants a=5.488 Å, b=5.745 Å, and c=7.934 Å and DyScO$_3$ has lattice constants a=5.440 Å, b=5.713 Å, and c=7.887 Å. In these structures the (110) plane, spanned by [1$\bar{1}$0] and [001] directions, provides a nearly square base with c/2=3.967 Å and $\sqrt{a^2+b^2}/2$=3.973 Å for the in-plane surface mesh of (110) GdScO$_3$ and c/2=3.943 Å and $\sqrt{a^2+b^2}$2=3.944 Å for (110) DyScO$_3$. Thus, (110) GdSCO$_3$ and (110) DyScO$_3$ substrates provide ϵ$_s$ of about −1.0% and −1.7%, respectively, for the epitaxial growth of coherent (001) BaTiO$_3$ films. The pseudo-cubic lattice parameters of other rare earth scandates are given in Table 2 below.

TABLE 2

Rare Earth Scandates, pseudo-cubic lattice parameters

| Material | a(Å) | b(Å) | c(Å) | c/2(Å) | $\frac{(a^2+b^2)^{1/2}}{2}$ (Å) | Angle(a^b) |
|---|---|---|---|---|---|---|
| LaScO$_3$ | 5.678 | 5.787 | 8.098 | 4.049 | 4.053 | 88.927 |
| CeScO$_3$ | 5.787 | 5.626 | 8.047 | 4.023 | 4.036 | 91.633 |
| PrScO$_3$ | 5.770 | 5.602 | 8.010 | 4.005 | 4.021 | 91.710 |
| NdScO$_3$ | 5.770 | 5.579 | 7.999 | 4.000 | 4.013 | 91.945 |
| PmScO$_3$ | 5.56 | 5.79 | 7.94 | 3.970 | 4.0136 | 87.694 |
| SmScO$_3$ | 5.524 | 5.750 | 7.953 | 3.977 | 3.987 | 87.719 |
| EuScO$_3$ | 5.502 | 5.750 | 7.954 | 3.977 | 3.979 | 87.491 |
| GdScO$_3$ | 5.488 | 5.746 | 7.934 | 3.967 | 3.973 | 87.385 |
| TbScO$_3$ | 5.466 | 5.727 | 7.915 | 3.958 | 3.958 | 87.344 |
| DyScO$_3$ | 5.440 | 5.713 | 7.887 | 3.943 | 3.944 | 87.212 |
| HoScO$_3$ | 5.427 | 5.714 | 7.895 | 3.947 | 3.940 | 87.065 |
| ErScO$_3$ | | | | | | |
| TmScO$_3$ | 5.3913 | 5.6808 | 7.886 | 3.943 | 3.9159 | 87.020 |
| YbScO$_3$ | | | | | | |
| LuScO$_3$ | | | | | | |
| BaTiO$_3$ | 3.994 | | 4.038 | | | 90 |
| SrTiO$_3$ | 3.905 | | | | | 90 |

The epitaxial BaTiO$_3$ thin films were grown on (110) GdScO$_3$ and (110) DyScO$_3$ substrates by both MBE and PLD. For the films grown by MBE, molecular beams of the constituent elements were supplied to the surface of untwined (110) GdScO$_3$ and (110) DyScO$_3$ substrates held at 700° C. A mixture of 90% O$_2$ and 10% ozone at a background pressure of 5×10$^{-6}$ Torr was used as the oxidant, incident upon the substrate via a directed inlet nozzle. The BaTiO$_3$ was deposited by the sequential deposition of BaO and TiO$_2$ monolayers, where each monolayer dose was controlled in real time by feedback from reflection high-energy electron diffraction (RHEED) intensity oscillations. To grow BaTiO$_3$ films by PLD, untwined (110) GdScO$_3$ and (110) DyScO$_3$ substrates were attached to a resistive heater and positioned 5.0 cm from the target. A KrF excimer laser (248 nm) beam was focused on a stoichiometric BaTiO$_3$ target to an energy density of 2.0 J/cm$^2$ and pulsed at 5 Hz. BaTiO$_3$ films were grown at substrate temperatures ranging from 650 to 800° C. and oxygen pressures of 100-150 mTorr. The PLD system is equipped with high-pressure RHEED, which enabled the layer-by-layer growth of the thin films to be monitored in situ during growth.

The three-dimensional strain state of the films was determined using high-resolution four-circle x-ray diffraction. The crystalline perfection of the films was assessed by measuring the full width at half maximum (FWHM) in ω (rocking curve) of the 002 BaTiO$_3$ reflection.

Figure 8:
FIG. 8 is a bright-field TEM image showing a 200 nm thick BaTiO$_3$ film grown on a (110) GdScO$_3$ substrate with a (110) SrRuO$_3$ bottom electrode layer.
Figures 9, 10, 11:
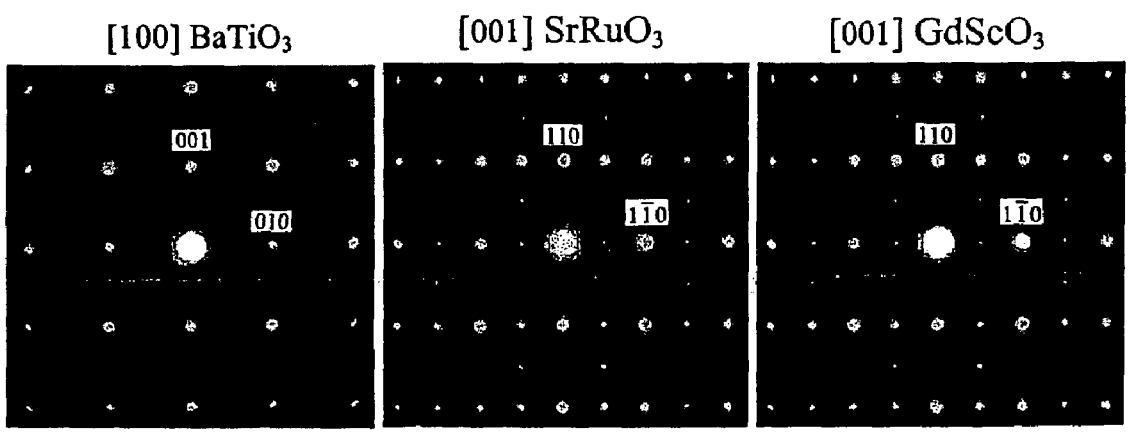
FIG. 9 is a selected area electron diffraction pattern corresponding to the BaTiO$_3$ layer.
FIG. 10 is a selected area electron diffraction pattern corresponding to the SrRuO$_3$ layer.
FIG. 11 is a selected area electron diffraction pattern corresponding to the GdScO$_3$ substrate.
Figure 12:
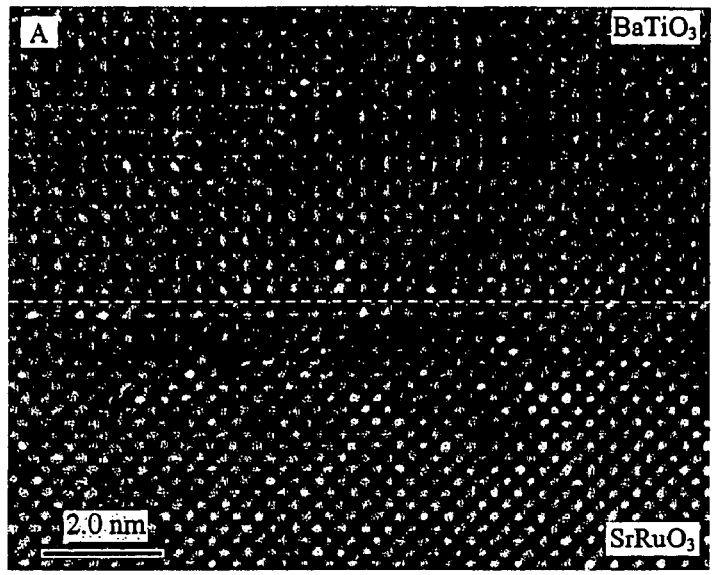
FIG. 12 is a high resolution TEM image showing the BaTiO$_3$/SrRuO$_3$ interface with a dashed line marking the position of the interface.
Figure 13:
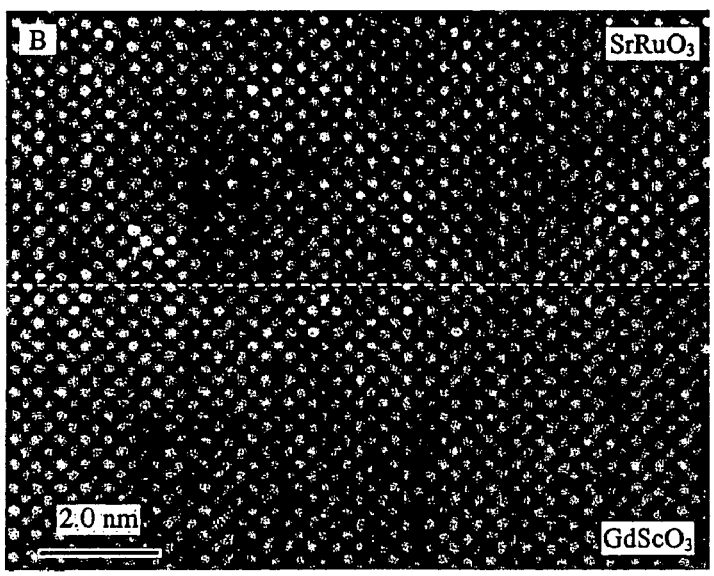
FIG. 13 is a high resolution TEM image showing the SrRuO$_3$/GdScO$_3$ interface with a dashed line marking the position of the interface.

The microstructure and interfacial structure of the BaTiO$_3$ thin films grown on both GdScO$_3$ and DyScO$_3$ substrates were characterized by cross-sectional transmission electron microscopy (TEM). FIG. 8 is a bright-field TEM image showing a 200 nm thick BaTiO$_3$ film grown on a (110) GdScO$_3$ substrate with a (110) SrRuO$_3$ bottom electrode layer. The corresponding selected area electron diffraction patterns for each film layer and the substrate are shown in FIGS. 9-11. It was found that the BaTiO$_3$ film grows epitaxially and is purely c-axis oriented normal to the substrate through the whole film. No misfit dislocations are seen along the interface between GdScO$_3$ and SrRuO$_3$ or along the interface between SrRuO$_3$ and BaTiO$_3$. This indicates that both the SrRuO$_3$ and BaTiO$_3$ films are strained to the lattice spacing of the substrate by coherent epitaxial growth, which is consistent with the x-ray data shown in FIG. 7 and Table 1. The change in the diffraction contrast of the BaTiO$_3$ film indicates that the film is highly strained. High-resolution TEM images of the BaTiO$_3$/SrRuO$_3$ and SrRuO$_3$/GdScO$_3$ interfaces are shown in FIGS. 12-13. Sharp interfaces are seen both between GdScO$_3$ and SrRuO$_3$ and between SrRuO$_3$ and BaTiO$_3$. The position of the interfaces is indicated by dashed lines.

To measure the polar plots shown in the inset of FIG. 5, incident light at frequency ω (wavelength 900 nm) was polarized at an angle of θ to the x-y plane and ϕ$_i$=23° to the surface normal (z) of the GdScO$_3$ substrate. The incident fundamental polarization was p-polarized and the output SHG polarization (I$^{2\omega}$ at frequency 2ω (wavelength of 450 nm)) was p-polarized (θ=0°) for the film and s-polarized (θ=90°) for the single crystal.

Figure 14:
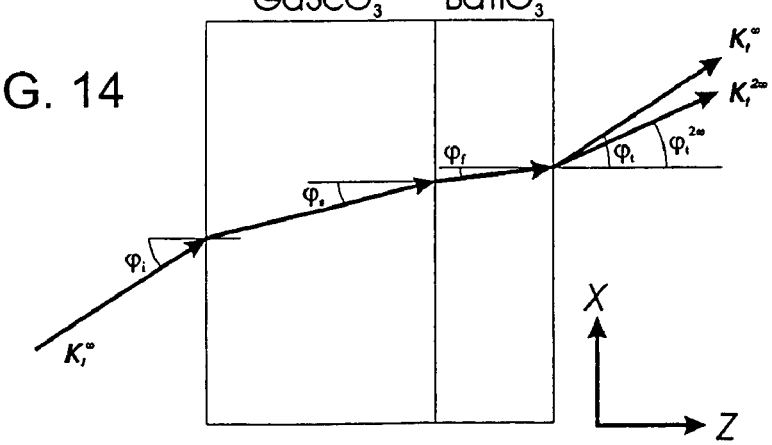
FIG. 14 is a schematic diagram of the geometry of the SHG measurement (not to scale), showing wavevectors k$^\omega$ and k$^{2\omega}$ for the fundamental frequency ($\omega$) and the second harmonic frequency (2$\omega$) and the incidence and refraction angles $\phi$, with the subscripts i, s, f, and t, corresponding to incidence, substrate, film, and transmitted, respectively.

The general expression for this SHG intensity is given by $$I^{2\omega}=K_1(\cos^2\theta+K_2\sin^2\theta)^2+K_3\sin^2(2\theta)$$

where $K_1$, $K_2$, and $K_3$ are constants that depend on nonlinear coefficients ($d_{31}$, $d_{33}$, and $d_{15}$), geometric factors involving Fresnel coefficients, the angles shown in FIG. 14, and microstructural parameters involving the relative area fraction of various polarization variants (domains) in the $BaTiO_3$ film.

No SHG signal was detected for normal incidence on the film system ($\phi_i=0°$) in FIG. 5, confirming that the strained $BaTiO_3$ film is indeed predominantly c-axis (001) oriented. X-ray diffraction measurements revealed that following the temperature cycling of the SHG measurement shown in FIG. 5, the film contained ~0.8% by volume of a-domains. These domains have polarization $P_s$ along the ±x and ±y directions.

The first term in the equation above involving the constants $K_1$ and $K_2$ arises predominantly from domains with polarization $P_s$ along the ±z directions, and possibly a small amount of contribution from domains with $P_s$ along the ±x directions. The second term arises from a small SHG contribution from domains with polarization $P_s$ along the ±y directions. The ratio, $I^{2\omega}(\theta=0°)/I^{2\omega}(\theta=90°)=1/K_2^2$, corresponding to the ratio of p-to-s polarized SHG intensity from the film, is related purely to intrinsic nonlinear coefficients of the film ($d_{31}$, $d_{33}$, and $d_{15}$) and fixed geometric factors, and is independent of the film domain microstructure. Numerical fitting of the polar plots yields the constant $1/K_2=-2.2\pm0.01$, which is therefore related to intrinsic $BaTiO_3$ material properties. This constant is found to remain constant between 50° C. and 400° C. in the polar plots, but decreases thereafter in polar plot measurements up to 700° C. This indicates a discontinuity in the intrinsic material property beyond the $T_c$ in the strained $BaTiO_3$ film.

It is understood that the invention is not confined to the particular embodiments set forth herein as illustrative, but embraces all such forms thereof as come within the scope of the following claims.

What is claimed is:

1. A strained thin film structure comprising:
   (a) a substrate layer formed of a crystalline rare earth scandate material and having a top surface;
   (b) a strained layer of crystalline ferroelectric material epitaxially grown with respect to the crystalline substrate layer so as to be in a strained state and at a thickness below which dislocations begin to occur.

2. The thin film structure of claim 1 wherein the ferroelectric layer has a thickness of 5 μm or less.

3. The thin film structure of claim 1 including an intermediate layer of material grown between the top surface of the substrate layer and the ferroelectric layer wherein the intermediate layer carries that lattice structure of the underlying substrate layer.

4. The thin film structure of claim 3 wherein the intermediate layer comprises $SrRuO_3$ between the top surface of the substrate layer and the layer of ferroelectric and epitaxially grown on the substrate layer.

5. The thin film structure of claim 4 wherein the layer of $SrRuO_3$ is 1 μm or less in thickness.

6. The thin film structure of claim 4 further including an additional layer of $SrRuO_3$ formed over the ferroelectric layer whereby the layers of $SrRuO_3$ can function as plates of a capacitor separated by the layer of ferroelectric acting as a dielectric.

7. The thin film structure of claim 1 further including a base of crystalline silicon on which the substrate layer is formed.

8. The thin film structure of claim 1 wherein the thickness of the ferroelectric layer is at least 50 Å.

9. The thin film structure of claim 8 wherein the thickness of the ferroelectric layer is less than 5 μm.

10. The thin film structure of claim 1 wherein the substrate layer is formed of a material selected from the group consisting of $GdScO_3$ and $DyScO_3$, and the strained layer ferroelectric material comprises $BaTiO_3$.

11. The thin film structure of claim 10 wherein the strained layer is formed of (001) $BaTiO_3$ and the substrate layer is formed of (110) $GdScO_3$ or (110) $DyScO_3$.

12. The thin film structure of claim 1 wherein the strained layer is grown epitaxially by molecular beam epitaxy.

13. The thin film structure of claim 1 wherein the strained layer is grown epitaxially by pulsed laser deposition.

14. The thin film structure of claim 1 wherein the substrate layer is $DyScO_3$.

15. The thin film structure of claim 14 wherein the strained layer of $BaTiO_3$ has a thickness of 500 Å or less.

16. The thin film structure of claim 1 incorporated into a ferroelectric memory.

17. The thin film structure of claim 1 incorporated into an electra-optical modulator.

18. The thin film structure of claim 1 wherein the structure is located outside of a deposition system in which the strained layer of crystalline ferroelectric material is grown.

19. A strained thin film structure comprising:
   (a) a substrate layer formed of a crystalline material selected from the group consisting of $GdScO_3$ and $DyScO_3$ and having a top surface;
   (b) a strained layer of crystalline $BaTiO_3$ epitaxially grown with respect to the crystalline substrate layer so as to be in a strained state and at a thickness below which dislocations begin to occur.

20. The thin film structure of claim 19 wherein the $BaTiO_3$ layer has a thickness of 5 μm or less.

21. The thin film structure of claim 19 including an intermediate layer of $SrRuO_3$ between the top surface of the substrate layer and the layer of $BaTiO_3$ and epitaxially grown on the substrate layer.

22. The thin film structure of claim 21 wherein the layer of $SrRuO_3$ is 1 μm or less in thickness.

23. The thin film structure of claim 21 further including an additional layer of $SrRuO_3$ formed over the $BaTiO_3$ layer whereby the layers of $SrRuO_3$ can function as plates of a capacitor separated by the layer of $BaTiO_3$ acting as a dielectric.

24. The thin film structure of claim 19 further including a base of crystalline silicon on which the substrate layer is formed.

25. The thin film structure of claim 19 wherein the thickness of the layer of $BaTiO_3$ is at least 50 Å.

26. The thin film structure of claim 25 wherein the thickness of the layer of $BaTiO_3$ is less than 5 μm.

27. The thin film structure of claim 19 wherein the strained layer is formed of (001) $BaTiO_3$ and the substrate layer is formed of (110) $GdScO_3$ or (110) $DyScO_3$.

28. The thin film structure of claim 19 wherein the strained layer is grown epitaxially by molecular beam epitaxy.

29. The thin film structure of claim 19 wherein the strained layer is grown epitaxially by pulsed laser deposition.

30. The thin film structure of claim 19 wherein the substrate layer is $DyScO_3$.

31. The thin film structure of claim 19 wherein the substrate layer is $GdScO_3$ and the strained layer of $BaTiO_3$ has a thickness of 2000 Å or less.

32. The thin film structure of claim 19 wherein the structure is located outside of a deposition system in which the strained layer of crystalline ferroelectric material is grown.

* * * * *